United States Patent [19]

Hudson

[11] 4,300,211
[45] Nov. 10, 1981

[54] DATA-STORAGE DEVICES AND BISTABLE CIRCUITS THEREFOR

[75] Inventor: Robert J. Hudson, London, England

[73] Assignee: Molins Limited, London, England

[21] Appl. No.: 4,114

[22] Filed: Jan. 17, 1979

[30] Foreign Application Priority Data

Feb. 2, 1978 [GB] United Kingdom ............... 4158/78

[51] Int. Cl.$^3$ ............................................. G11C 13/08
[52] U.S. Cl. .................................... 365/110; 365/215; 250/205
[58] Field of Search ............... 365/106, 110, 111, 112, 365/127, 215, 234; 307/311; 250/205

[56] References Cited

U.S. PATENT DOCUMENTS

| | | | |
|---|---|---|---|
| 2,742,631 | 4/1956 | Rajchman et al. | 365/106 |
| 3,274,389 | 9/1966 | Schmermund | 250/205 |
| 4,157,481 | 6/1979 | Walton | 307/311 |

FOREIGN PATENT DOCUMENTS 2410314  9/1975  Fed. Rep. of Germany ...... 307/311

OTHER PUBLICATIONS

Fujiwara et al., Photointerrupters, National Technical Report, vol. 22, No. 1, pp. 41–51, 2/76.
Rice et al., ELPC Direct Readin Memory Drum, IBM Tech. Disc. Bul., vol. 3, No. 8, 1/61, pp. 55–56.
Anacker et al., Beam-Operated Memory Cells, IBM Tech. Disc. Bul., vol. 9, No. 6, 11/66, pp. 737–738.
Astrahan, EL-PC Keyboard, IBM Tech. Disc. Bul., vol. 13, No. 3, 8/60, pp. 65–66.

*Primary Examiner*—Stuart N. Hecker
*Attorney, Agent, or Firm*—John C. Smith, Jr.

[57] ABSTRACT

A bistable circuit comprises a light-emitting diode connected in series with a phototransistor and so disposed as to illuminate the latter. When current is flowing—i.e. when the phototransistor conducts—light from the LED keeps the phototransistor conductive, and the circuit can be switched to the non-conductive (OFF) state by interrupting the light path between the LED and the phototransistor. When the circuit is OFF it can be switched to the ON state by external light.

A data-storage device embodying such bistable circuits is also disclosed; a rotatable disc carries a plurality of such circuits at regular spacings adjacent its periphery, and several setting devices at different positions are each operable to illuminate one of the circuits passing the setting device to switch that circuit to the ON state. After passing the several setting devices, each circuit is carried past a sensing device which detects whether the circuit is ON (by detecting whether light is being emitted from the circuit) and thereafter past a stationary shutter so placed as to interrupt the light path of the circuit and hence reset any circuit which is ON to the OFF state.

18 Claims, 4 Drawing Figures

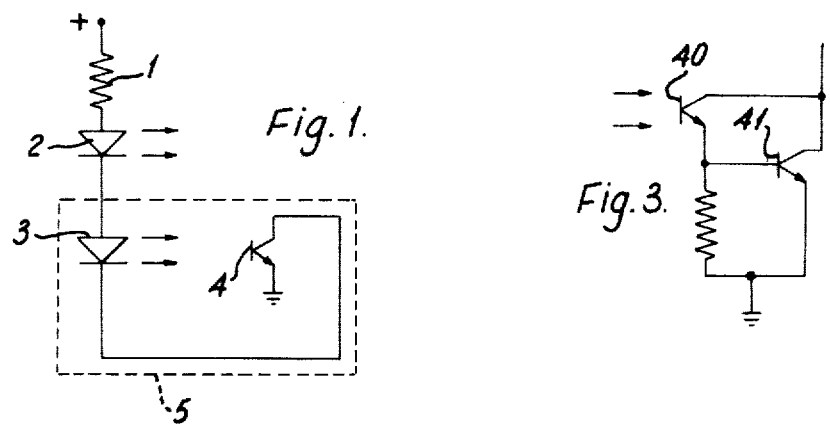
Fig. 1.
Fig. 3.
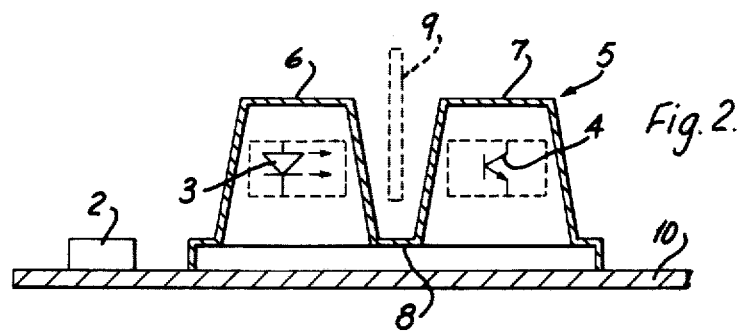
Fig. 2.
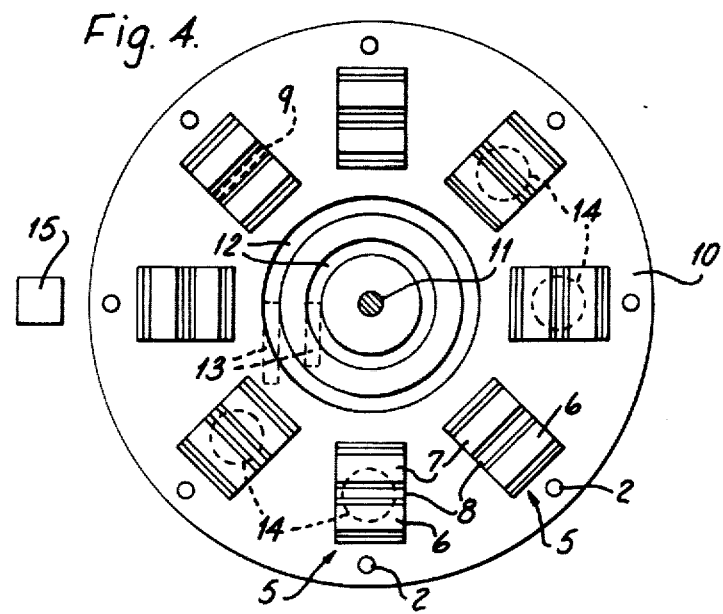
Fig. 4.

DATA-STORAGE DEVICES AND BISTABLE CIRCUITS THEREFOR

This invention relates to data-storage devices and bistable circuits therefor. Such devices and circuits may be used for a variety of purposes, for example in machines for making products such as cigarette packets in which an indication that a product is faulty may need to be stored while that product moves to a position at which a rejector can be operated in response to the stored fault indication.

According to a first feature of the invention there is provided a bistable circuit comprising an electrically-energised light-emitting element and a photoconductive device connected in series with one another so that light is emitted by said element when said device is conductive and so disposed relative to one another that such emitted light illuminates said device to maintain it in the conductive condition. When connected to a suitable electric supply, such a circuit remains in an "off" condition (i.e. does not draw current) until the photoconductive device is illuminated by light from an external source; the device becomes conductive, the light-emitting element is energised and emits light which continues the illumination of the photo-conductive device after the external source is turned off, so the circuit is now in the "on" condition. It can be reset to the "off" condition by interrupting the illumination of the photoconductive device, conveniently by interposing an opaque member between the light-emitting element and the device.

It will be apparent that the photoconductive device must not be permitted to be subject to external light when the circuit is "off", other than at times when it is desired to change the state of the circuit from "off" to "on". This is accomplished by employing a light-emitting element and a photoconductive device which respectively emit and respond to infra-red radiation, not visible light, and mounting both the element and the device under a cover which is opaque to visible light but transmits infra-red rays. The cover is recessed between the element and the device, so that a shutter member outside the cover may interrupt the light from the element to the device, when it is desired to restore the circuit to the "off" condition.

Preferably the element is a light-emitting diode and the photoconductive device is a phototransistor. A further light-emitting diode may be included in the circuit, this further diode being of a type which emits visible light to provide a visible indication of the condition of the circuit.

Such bistable circuits may be used for various purposes. According to a further feature of the invention, there is provided a data-storage device comprising a rotatable (preferably circular) disc on which are carried, at regularly-spaced positions adjacent to the periphery thereof, a plurality of bistable circuits as defined above, a sensing device at a relatively-fixed position adjacent to the periphery of said disc for detecting when any one of the circuits on the disc is emitting light (i.e. is "on") as it moves past the sensing device, at least one setting device arranged at another relatively-fixed position adjacent to the disc and operable when any one of said circuits is adjacent to said setting device to direct light on to said one circuit to make the device therein conductive (i.e. to switch "on" the circuit), and a resetting device comprising a shutter member at a further relatively-fixed position so placed adjacent to said disc that as the disc rotates, the light-emitting element and the photoconductive device of each circuit pass on opposite sides of said shutter member so that the latter interrupts passage of light from the element to the device.

In order that the invention may be well understood, a preferred embodiment thereof will now be described in which a plurality of bistable circuits embodying the invention are employed in place of electromechanical devices in a rotary data-storage device, reference being made to the accompanying diagrammatic drawings in which:

FIG. 1 is a diagram of a bistable circuit embodying the invention;

FIG. 2 is a view, partly in section, showing the relative positions of parts of the circuit of FIG. 1;

FIG. 3 shows an alternative form of part of the circuit of FIG. 1; and

FIG. 4 is a plan view of a rotary data-storage device.

Referring first to FIG. 1, a circuit is shown in which a limiting resistor 1, light-emitting diodes 2, 3, and a phototransistor 4 are connected in series between a positive supply terminal and earth. Light-emitting diode 2 is of a type that emits visible light when current is passing through it, while diode 3 is of a type which emits infra-red radiation. Phototransistor 4 is of a type which becomes conductive on exposure to infra-red radiation.

The diode 3 and phototransistor 4 are mounted in such relative positions that when the diode 3 is emitting infra-red radiation, that radiation reaches the phototransistor 4 sufficiently to cause the latter to assume its conductive state and the voltage at the positive supply terminal is such that when the phototransistor 4 is conductive, the light-emitting diode 3 is energised so that the infra-red radiation received by phototransistor 4 from the diode 3 is sufficient to maintain the former in its conductive state; the light-emitting diode 2 at the same time emits visible light giving a visible indication that the circuit is "on" i.e. is passing current.

The dashed rectangle 5 indicates a cover within which the diode 3 and phototransistor 4 are enclosed. The cover 5 is of material which is opaque to visible light but which (at least in part) transmits infra-red radiation; such radiation may therefore, when the circuit is "off", be applied through the cover 5 to cause the phototransistor 4 to assume its conductive state. FIG. 2 illustrates one preferred form and disposition of the cover 5, diode 3 and phototransistor 4; the cover 5 comprises a hollow moulding having two raised portions 6, 7 in which the diode 3 and phototransistor 4 are respectively placed, in such positions that when the diode 3 is energised, radiation from it is directed towards the phototransistor 4 which is itself so disposed as to respond to such radiation. Between the raised portions 6, 7 the cover 5 has a depressed portion 8, so that radiation travelling between the diode 3 and phototransistor 4 has to pass through the walls of both the raised portions 6, 7. This arrangement allows a shutter member 9 (indicated in dashed line) to be placed in the path of said radiation when it is desired to put the circuit in the "off" condition. The cover 5 is carried on an opaque support (which is part of a rotatable disc) 10.

When the circuit is in the "off" condition, it can be switched to the "on" condition by briefly directing infra-red radiation from any convenient source (not shown) downwardly on to the cover 5, to pass there-through and irradiate the phototransistor 4. In the absence of the member 9, as soon as the phototransistor responds to such radiation, diode 3 is energised and radiation from the diode 3 maintains the phototransistor in its conductive state.

FIG. 3 shows an alternative for part of the circuit of FIG. 1, namely a phototransistor 40 coupled to a transistor 41 serving to amplify the output of the phototransistor itself. In practice, something of this nature is generally necessary as the characteristics of available light-emitting diodes and phototransistors are such that the illumination provided by the diode does not cause the phototransistor to pass sufficient current to maintain the necessary light output from the diode. Addition of an amplifier, which may be a single transistor as in FIG. 3, serves to match the diode and phototransistor characteristics.

As shown in FIG. 4, a data-storage device embodying bistable circuits as described above has eight such circuits carried on the disc 10, which is in turn carried on a rotatable shaft 11. On the surface of the disc 10 are two rings 12, which are coaxial with the shaft 11 and are of metal or other electrically-conductive material, the disc being of insulating material. The rings 12 are provided to permit the electric supply to be brought to the bistable circuits via stationary brushes 13 in engagement with the rings 12. The electrical connections are not shown on FIG. 4; connections such that each circuit is as shown in FIG. 1 are preferably made by applying a suitable printed circuit to the lower face of the disc.

The eight circuits are regularly spaced around the disc 10, i.e. in a circle centred on the shaft 11 and on radii spaced at 45°. The cover 5 of each circuit is so disposed that its raised portion 6 is farther away from the shaft 11 than is the raised portion 7, and light-emitting diode 2 is mounted on the disc 10 between the cover 5 and the periphery of the disc.

At four places fixed infra-red sources 14 are mounted above the disc 10, as indicated by dashed circles. As shown, such sources are mounted above the disc at the 1.30, 3.0, 6.0, and 7.30 o'clock positions, and are centred at the same radius from the axis of the shaft 11 as the centres of the depressed portions 8 of covers 5. Fixed at the 9.0 o'clock position, outside the periphery of the disc 10, is a photoelectric sensor 15, at a level just above the upper surface of the disc so as to receive light from any one of the diodes 2 which is energised when it is adjacent to said sensor 15. Fixed above the disc at about the 10.30 o'clock position is the shutter member 9, at such a height that whenever one of the covers 5 passes below said shutter member the raised portions 6, 7 of the cover pass on either side of the member 9 in the relative positions shown in FIG. 2.

In use of the device illustrated in FIG. 4, the disc 10 rotates clockwise. Whenever one of the fixed infra-red sources 14 is energised while one of the covers 5 is below that source, the radiation from the fixed source causes the phototransistor under that cover 5 to assume its conductive state and hence, as previously described with reference to FIGS. 1 and 2, the bistable circuit associated with that perticular cover 5 is switched "on", diode 3 emitting infra-red radiation which maintains the phototransistor 4 conductive after the latter ceases to receive radiation from the fixed source. Diode 2 is also energised and emits visible light. The circuit remains in the "on" condition until rotation of the disc moves the cover 5 through the 10.30 o'clock position, where the member 9 interrupts the passage of infra-red radiation between the diode 3 and phototransistor 4, switching the circuit "off". Before this happens, however, the circuit while still "on" has passed the sensor 15 at the 9.0 o'clock position and the latter has emitted a signal as a result of its detection of the light being emitted by the diode 2.

The device of FIG. 4 may be used for storing fault indications in, for example, a cigarette-packing machine. The infra-red sources 14 are connected to fault-sensing units at different positions along the path of packets being formed in the packing machine and the sensor 15 is connected to a rejector device for segregating faulty packets at a further position along said path. The shaft 11 is connected to the packing machine drive so that the movement of the covers 5 and diodes 3 below the infra-red sources 14 and past the sensor 15 is synchronised with the movements of packets past the fault-sensing devices and rejector device of the machine. (It should be noted that the number and placing of the fixed infra-red sources in FIG. 4 is purely illustrative; in use in a packing machine as above, the position of the sources around the disc 10 will correspond to the positions of the fault-sensing devices along the path of packets in the machine so that as a particular packet passes each successive one of the fault-sensing devices, one particular cover 5 passes the corresponding one of the sources, which is connected to that one fault-sensing device so that the source is energised if a fault is sensed. The position of the sensor 15 similarly corresponds to the position of the rejector device along the packet path).

The fact that each diode 2 emits visible light when its bistable circuit is "on" as a stored fault indication not only allows the sensor 15 to operate the rejector device as above, but also permits the incidence of faults to be visually monitored by an observer looking at the disc 10. Also, as the bistable circuits are mutually similar and each circuit draws current when it is "on" to store a fault indication, but does not draw current when not storing an indication, the total current being drawn through rings 12 and brushes 13 at any moment is directly proportional to the number of fault indications stored then. Thus an ammeter placed in the supply to one of the brushes 13 may be directly calibrated to read the number of stored fault indications and/or a relay device similarly connected and operable at a selected current level may be used to energise an alarm device.

The infra-red sources 14, the sensor 15, and shutter member 9 are in operation maintained at fixed positions, but they may be so mounted as to permit their positions to be adjusted so that accurate synchronisation may be obtained between the operations of the data-storing device and related functions of a machine with which it is associated. Said sources 14 may take various forms; it has been found convenient to use in each such source a light-emitting diode which, during the period that a fault is sensed, is energised. Preferably such energisation is not by a steady d.e. supply, but by a pulsed supply which permits the light-emitting diode to run at a high power level during each pulse, the mark/space ratio of the pulsed supply being such that the mean power rating of the diode is not exceeded.

The sensor 15 may be so arranged that whenever two or more consecutive ones of the bistable circuits are "on", and hence have their light-emitting diodes 2 lit to operate the sensor, the latter responds to the light from the first diode 2 and then does not change its state until the last of the two or more lit diodes has passed. Such a result may for example be achieved by providing in the sensor 15 two (or more) phototransistors in parallel and spaced apart so as to be successively illuminated by each lit diode 2. A similar result may be achieved by providing a single phototransistor in the sensor 15, with a light guide such as a tapered piece of transparent material (e.g. that sold under the trade mark "Perspex"); the single phototransistor is placed at the narrow end of the light guide and the wide end of the latter is placed adjacent the path of the diodes 2, so that the phototransistor in the sensor receives light from each lit diode 2 for as long as the latter is in a region adjacent to said wide end of the light guide, and the width of said wide end is such that each diode 2 enters said region before the preceding diode 2 has left said region.

Although only one sensor 15 is shown, two or more such sensors may be provided at different positions if required. This is advantageous when a device embodying the invention is used with a machine in which more than one action is required, at different times, in response to detection of a fault. For example, when such a device is associated with a cigarette-packing machine in which groups of cigarettes are formed and enclosed first in foil, then in a card packet formed from a flat blank, and lastly in an outer wrapper, a fault in a cigarette group desirably results not only in rejection of that group, but also causes feed of the foil, of the packet blank, and of overwrap material to be inhibited to avoid waste.

I claim:

1. A bistable circuit comprising an electrically-energized infra-red-emitting diode and an infra-red responsive phototransistor responsive to infra-red radiation connected in series with one another so that infra-red radiation is emitted by said diode when said phototransistor is conductive and so disposed relative to one another that such emitted infra-red radiation irradiates said phototransistor to maintain it in conductive condition, a transistor amplifier coupled to said phototransistor to amplify the output of the latter to cause said diode to emit sufficient infra-red radiation to maintain said phototransistor conductive, a cover in the form of a hollow molding which is opaque to visible light but transmits infra-red rays, said molding having two raised portions in which said diode and said phototransistor are respectively located and a depressed portion between said raised portions so that radiation traveling from the diode to the phototransistor passes through the walls of said raised portions and a visible light-emitting element connected in series with said infra-red-emitting diode and phototransistor, said visible light-emitting element being positioned externally of said cover to indicate visually when said circuit is in the ON state.

2. A data-storage device comprising a rotatable disc on which are carried, at regularly-spaced positions adjacent to the periphery thereof, a plurality of bistable circuits as claimed in claim 1, a sensing device at a relatively-fixed position adjacent to the periphery of the disc for detecting when any one of the visible light-emitting elements on the disc is emitting light as it moves past the sensing device, at least one setting device arranged at another relatively-fixed position adjacent to the disc and operable when any of said circuits is adjacent to said setting device to direct infrared radiation on to said one circuit to make the device therein conductive, and a resetting device comprising a shutter member at a further relatively-fixed position so placed adjacent to the disc that as the disc rotates, the infrared-emitting diode and the phototransistor of each circuit in the respective raised portions of said molding pass on opposite sides of said shutter member so that the latter interrupts passage of infrared radiation from the diode to the phototransistor to place each circuit in the OFF state.

3. A data-storage device as claimed in claim 2, in which the bistable circuits are connected to two conductive rings on the surface of the disc, said rings being coaxial with a shaft on which the disc is carried, and two stationary brushes being engaged with said rings to permit an electric supply to be brought to said circuits via said rings.

4. A data-storage device as claimed in claim 2 further comprising electrical circuit means for supplying electrical current to said plurality of bistable circuits and means in said electrical circuit means for detecting the current level therein to determine the number of bistable circuits which are in the ON state at any one time.

5. A data-storage device as claimed in claim 2 further comprising electrical circuit means for supplying electrical current to said plurality of bistable circuits and signal means for detecting a predetermined current level in said electrical circuit means corresponding to the combined current drawn by a predetermined minimum number of said bistable circuits.

6. A data-storage device as claimed in claim 2 wherein said visible light sensing means is adapted to simultaneously sense a plurality of adjacent visible light-emitting elements when lit.

7. A data-storage device as claimed in claim 6 wherein said visible light sensing means comprises a plurality of phototransistors in parallel and spaced apart so as to be successively illuminated by each visible light-emitting element when lit.

8. A data-storage device as claimed in claim 6 wherein said visible light sensing means comprises a single phototransistor and a light guide arranged to simultaneously transmit light from a plurality of consecutive visible light-emitting elements when lit.

9. A bistable circuit comprising:
(a) an infra-red-responsive phototransistor means comprising a phototransistor and a transistor amplifier coupled to said phototransistor to amplify the output of said phototransistor;
(b) an infra-red-emitting diode spaced from said phototransistor means such that it is capable of irradiating said phototransistor means to make said phototransistor means conductive;
(c) means electrically connecting said diode and phototransistor means in series with one another;
(d) said phototransistor means being adapted, when irradiated by said diode, to pass sufficient current to cause said diode to emit sufficient infra-red radiation to maintain said phototransistor means conductive;
(e) means housing said phototransistor means and diode, each in respective compartments, said housing means being opaque to visible light to shield said diode and phototransistor from visible light but transmitting infra-red radiation;
(f) whereby when said bistable circuit is in the ON state the infra-red radiation from said diode is transmitted along a path through the wall of both compartments to said phototransistor, and said bistable circuit may be placed in the OFF state by placing an obstruction, opaque to infra-red radiation, in said path between said compartments; and (g) a visible light-emitting element, said electrical connecting means connecting said diode, phototransistor means and visible light-emitting element in series, said visible light-emitting element being positioned externally of said housing means to indicate visually when said circuit is in the ON state.

10. A data-storage device comprising:
(a) first and second mounting means, one of said mounting means being movable along a predetermined path adjacent to the other of said mounting means;
(b) a plurality of bistable circuits according to claim 9 positioned at spaced intervals of one of said mounting means; and
(c) visible light sensing means, at least one infrared-emitting setting means and shutter means positioned on the other of said mounting means whereby said plurality of bistable circuits on the one hand and said means, at least one infrared-emitting setting means and shutter means on the other hand pass each other during movement of said one mounting means;
(d) said sensing means being adapted to detect any at least one of said circuits when said one circuit is in the ON state and its respective visible light-emitting element is emitting visible light as said sensing means and said visible light-emitting element pass each other;
(e) said at least one infrared-emitting setting means being operable, when any one of said circuits and said light-emitting setting means pass each other, to direct infrared radiation onto the phototransistor means of said one circuit to make said phototransistor means conductive;
(f) said shutter means being arranged such that said respective compartments housing said infrared-emitting diode and said phototransistor means of each bistable circuit and said shutter means pass each other with said shutter means interposed between said compartments such that said shutter means interrupts passage of infrared radiation from said diode to said phototransistor means of a circuit in the ON state to place said circuit in the OFF state.

11. A data-storage device comprising:
(a) mounting means movable along a predetermined path;
(b) a plurality of bistable circuits according to claim 9 positioned on said mounting means;
(c) visible light sensing means at a first position adjacent said path for detecting any at least one of said circuits when said one circuit is in the ON state and its respective visible light-emitting element is emitting visible light as said visible light-emitting element moves past said sensing means;
(d) at least one infrared-emitting setting means at a second position adjacent said path upstream of said first position and operable when any one of said circuits moves past said second position to direct infrared radiation onto the phototransistor means of said one circuit to make said phototransistor means conductive; and
(e) shutter means at a third position adjacent said path downstream of said first position and arranged such that said respective compartments housing said infrared-emitting diode and said phototransistor means of said bistable circuit pass on opposite sides, respectively, of said shutter means whereby said shutter means interrupts passage of infrared radiation from said diode to said phototransistor means of a circuit in the ON state to place said circuit in the OFF state.

12. A data-storage device as claimed in claim 11 wherein said movable mounting means is a rotatably mounted structure.

13. A data storage device as claimed in claim 12 wherein said rotatably mounted structure is a rotatably mounted disc.

14. A data-storage device as claimed in claim 11 further comprising electrical circuit means for supplying electrical current to said plurality of bistable circuits and means in said electrical circuit means for detecting the current level therein to determine the number of bistable circuits which are in the ON state at any one time.

15. A data-storage device as claimed in claim 11 further comprising electrical circuit means for supplying electrical current to said plurality of bistable circuits and signal means for detecting a predetermined current level in said electrical circuit means corresponding to the combined current drawn by a predetermined minimum number of said bistable circuits.

16. A data-storage device as claimed in claim 11 wherein said visible light sensing means is adapted to simultaneously sense a plurality of adjacent visible light-emitting elements when lit.

17. A data-storage device as claimed in claim 16 wherein said visible light sensing means comprises a plurality of phototransistors in parallel and spaced apart so as to be successively illuminated by each visible light-emitting element when lit.

18. A data-storage device as claimed in claim 16 wherein said visible light sensing means comprises a single phototransistor and a light guide arranged to simultaneously transmit light from a plurality of consecutive visible light-emittingelements when lit.

* * * * *